US012753529B2

(12) United States Patent
Yamagishi et al.

(10) Patent No.: US 12,753,529 B2
(45) Date of Patent: Oct. 6, 2026

(54) INDIUM PHOSPHIDE SUBSTRATE, METHOD FOR MANUFACTURING INDIUM PHOSPHIDE SUBSTRATE, AND SEMICONDUCTOR EPITAXIAL WAFER

(71) Applicant: JX Advanced Metals Corporation, Tokyo (JP)

(72) Inventors: Kodai Yamagishi, Kitaibaraki (JP); Shunsuke Oka, Kitaibaraki (JP); Kenji Suzuki, Kitaibaraki (JP)

(73) Assignee: JX ADVANCED METALS CORPORATION, Tokyo (JP)

( * ) Notice: Subject to any disclaimer, the term of this patent is extended or adjusted under 35 U.S.C. 154(b) by 488 days.

(21) Appl. No.: 18/034,327

(22) PCT Filed: Oct. 7, 2021

(86) PCT No.: PCT/JP2021/037241
§ 371 (c)(1),
(2) Date: Apr. 27, 2023

(87) PCT Pub. No.: WO2022/137728
PCT Pub. Date: Jun. 30, 2022

(65) Prior Publication Data
US 2023/0392289 A1 Dec. 7, 2023

(30) Foreign Application Priority Data
Dec. 21, 2020 (JP) ................................ 2020-211685

(51) Int. Cl.
*C30B 29/40* (2006.01)
*C30B 25/18* (2006.01)
(Continued)

(52) U.S. Cl.
CPC ............ *C30B 29/40* (2013.01); *C30B 25/186* (2013.01); *H10D 62/85* (2025.01);
(Continued)

(58) Field of Classification Search
CPC ...... C30B 25/186; C30B 29/40; H10D 62/85; H01L 21/02019; H01L 21/02021;
(Continued)

(56) References Cited

U.S. PATENT DOCUMENTS 6,245,678 B1 6/2001 Yamamoto et al.
6,902,987 B1 * 6/2005 Tong ...................... H10D 84/82
438/455

(Continued)

FOREIGN PATENT DOCUMENTS

EP 1150339 A1 * 10/2001 ....... H01L 21/02021
JP 11-204493 A 7/1999

(Continued)

OTHER PUBLICATIONS

Extended European Search Report for corresponding European Application No. 21909886.0, dated Sep. 17, 2024.

(Continued)

*Primary Examiner* — Jeff W Natalini
*Assistant Examiner* — Ian Isaac Degrasse
(74) *Attorney, Agent, or Firm* — Birch, Stewart, Kolasch & Birch, LLP

(57) ABSTRACT

Provided is an indium phosphide substrate, a method for manufacturing indium phosphide substrate, and a semiconductor epitaxial wafer capable of suppressing an occurrence of contamination of the surface of the indium phosphide substrate caused by residues at the edge part. An indium phosphide substrate, wherein a surface roughness of an edge part of the substrate has a root mean square height Sq of 0.15 μm or less, as measured by a laser microscopy on the entire surface of the edge part.

5 Claims, 2 Drawing Sheets

(51) Int. Cl.
*H10D 62/85* (2025.01)
*H10P 14/20* (2026.01)
*H10P 90/00* (2026.01)

(52) U.S. Cl.
CPC ........ *H10P 14/2909* (2026.01); *H10P 90/126* (2026.01); *H10P 90/128* (2026.01); *H10P 90/129* (2026.01)

(58) Field of Classification Search
CPC ......... H01L 21/02024; H01L 21/02392; H10P 90/128; H10P 90/126; H10P 90/129; H10P 14/2909
See application file for complete search history.

(56) References Cited

U.S. PATENT DOCUMENTS

| | | | | |
|---|---|---|---|---|
| 2004/0195658 | A1 | 10/2004 | Nakayama et al. | |
| 2007/0017900 | A1* | 1/2007 | Rupp | B24B 9/065 438/692 |
| 2008/0031510 | A1* | 2/2008 | Jung | H01L 21/67288 382/149 |
| 2010/0224964 | A1* | 9/2010 | Passek | H01L 21/02087 257/E29.022 |
| 2013/0264690 | A1 | 10/2013 | Masuda et al. | |
| 2015/0044947 | A1* | 2/2015 | Lu | B24B 37/044 451/41 |
| 2017/0179073 | A1* | 6/2017 | Moriceau | H10P 10/12 |
| 2018/0207770 | A1* | 7/2018 | Tolles | B24D 11/008 |
| 2019/0384166 | A1 | 12/2019 | Kishita | |
| 2021/0370459 | A1* | 12/2021 | Wang | B24B 7/228 |
| 2022/0199770 | A1 | 6/2022 | Itani et al. | |

FOREIGN PATENT DOCUMENTS

| | | | | |
|---|---|---|---|---|
| JP | 2001-135557 | A | | 5/2001 |
| JP | 2012-129416 | A | | 7/2012 |
| JP | 2012174935 | A | * | 9/2012 |
| JP | 2013-153181 | A | | 8/2013 |
| JP | 2019-219495 | A | | 12/2019 |
| JP | 6701418 | B1 | | 5/2020 |
| JP | 2020-157426 | A | | 10/2020 |
| WO | WO 2012/066761 | A1 | | 5/2012 |

OTHER PUBLICATIONS

International Search Report for PCT/JP2021/037241 (PCT/ISA/210) mailed on Nov. 2, 2021.

Chinese Office Action and Search Report for Chinese Application No. 202180054263.9, dated Aug. 23, 2025.

* cited by examiner

INDIUM PHOSPHIDE SUBSTRATE, METHOD FOR MANUFACTURING INDIUM PHOSPHIDE SUBSTRATE, AND SEMICONDUCTOR EPITAXIAL WAFER

FIELD OF THE INVENTION

The present invention relates to an indium phosphide substrate, a method for manufacturing indium phosphide substrate, and a semiconductor epitaxial wafer.

BACKGROUND OF THE INVENTION

Indium phosphide (InP) is a Group III-V compound semiconductor material composed of indium (In) of Group III and phosphorus (P) of Group V. The semiconductor material has characteristics in which a band gap is 1.35 eV, and an electron mobility is −5400 $cm^2/V{\cdot}s$, and the electron mobility under a high electric field is higher than that of other general semiconductor materials such as silicon and gallium arsenide. Further, the semiconductor material has characteristics in which its stable crystal structure under ordinary temperature and ordinary pressure is a cubic sphalerite type structure, and its lattice constant is larger than that of a compound semiconductor such as gallium arsenide (GaAs) and gallium phosphide (GaP).

An indium phosphide ingot which is a raw material for the indium phosphide substrate is generally sliced to have a predetermined thickness, ground to have a desired shape, mechanically polished as needed, and then subjected to etching or precision polishing in order to remove polishing debris and damage caused by polishing (Patent Literature 1).

Edge machining of the indium phosphide substrates is usually performed with a chamfering machine, using a #800 or #1200 grindstone.

CITATION LIST

Patent Literatures

[Patent Literature 1] Japanese Patent No. 6701418

SUMMARY OF THE INVENTION

If the surface roughness at the edge part of the indium phosphide substrate is large, the grinding abrasive used for chamfering and subsequent processing and the polishing fluid will remain on the edge part. Such residues at the edge part are brought into the final cleaning process and moved to the substrate surface by the lift-off action of the cleaning solution. The migration of residues to the substrate surface causes contamination of the surface of the indium phosphide substrate, which becomes the final product, and may lead to lower yields during substrate production. Contamination of the substrate surface may also lead to a decrease in surface quality after epitaxial growth is performed.

The present invention has been made to solve the above problems. An object of the present invention is to provide an indium phosphide substrate, a method for manufacturing indium phosphide substrate, and a semiconductor epitaxial wafer capable of suppressing an occurrence of contamination of the surface of the indium phosphide substrate caused by residues at the edge part.

The above issues are solved by an embodiment of the invention, identified as follows.

(1)

An indium phosphide substrate, wherein a surface roughness of an edge part of the substrate has a root mean square height Sq of 0.15 μm or less, as measured by a laser microscopy on the entire surface of the edge part.

(2)

The indium phosphide substrate according to (1), wherein the surface roughness of the edge part of the substrate has the root mean square height Sq of 0.07 μm or less.

(3)

The indium phosphide substrate according to (1) or (2), wherein the edge part of the substrate has

- a surface sloping from one surface; and
- a surface with curvature from the point where the sloping surface ends from one surface to the point where the sloping surface ends from the other surface; and a root mean square height Sq of the surface sloping from one surface, as measured by the laser microscopy, is 0.15 μm or less; and a root mean square height Sq of the surface with curvature, as measured by the laser microscopy, is 0.15 μm or less.

(4)

A method for manufacturing an indium phosphide substrate, comprising a process of chamfering an outer edge part of an indium phosphide wafer, a process of polishing the entire surface of the edge part of the indium phosphide wafer after the chamfering with a polishing film of #4000 grit size, and a process of etching the indium phosphide wafer after polishing the edge part of the indium phosphide wafer.

(5)

The method for manufacturing an indium phosphide substrate according to (4), further comprising a process of polishing at least one surface of the indium phosphide wafer between the process of chamfering the outer edge part of the indium phosphide wafer and the process of polishing the entire surface of the edge part of the indium phosphide wafer after the chamfering with a polishing film of #4000 grit size.

(6)

A semiconductor epitaxial wafer, comprising the indium phosphide substrate according to any one of (1) to (3), and an epitaxial crystal layer on a main surface of the indium phosphide substrate.

According to the embodiments of the present invention, it is possible to provide an indium phosphide substrate, a method for manufacturing indium phosphide substrate, and a semiconductor epitaxial wafer capable of suppressing an occurrence of contamination of the surface of the indium phosphide substrate caused by residues at the edge part.

DETAILED DESCRIPTION OF THE INVENTION

Indium Phosphide Substrate

Hereinafter, a structure of an indium phosphide substrate according to the present embodiment will be described.

The indium phosphide (InP) substrate according to the present embodiment includes a main surface, a back surface, and an edge part.

The edge part may have an orientation flat (OF), which indicates an orientation of a crystal, and an index flat (IF) to distinguish the main and back surfaces of the substrate.

The main surface of the indium phosphide substrate can be a surface for forming an epitaxial crystal layer. The surface for forming epitaxial crystal layers is the surface where epitaxial growth is actually performed when the indium phosphide substrate of this embodiment is used as a substrate for epitaxial growth to form semiconductor device structures.

The main surface of the indium phosphide substrate may have a maximum diameter of from 49 to 151 mm or from 49 to 101 mm, although not particularly limited thereto. A planar shape of the indium phosphide substrate may be circular or rectangular such as a quadrangle.

The indium phosphide substrate preferably has a thickness of from 300 to 900 μm, and more preferably 300 to 700 μm, for example, although not particularly limited thereto. Particularly when the diameter is higher, there may be problems that the indium phosphide substrate may be cracked if the substrate has a thickness of less than 300 μm, and a base crystal may be wasted if the substrate has a thickness of more than 900 μm.

The indium phosphide substrate may contain, as a dopant (impurity), Zn (zinc) such that a carrier concentration is $1\times10^{16}$ $cm^{-3}$ or more and $1\times10^{19}$ $cm^{-3}$ or less, and/or S (sulfur) such that a carrier concentration is $1\times10^{16}$ $cm^{-3}$ or more and $1\times10^{19}$ $cm^{-3}$ or less, and/or Sn (tin) such that a carrier concentration is $1\times10^{16}$ $cm^{-3}$ or more and $1\times10^{19}$ $cm^{-3}$ or less, and/or Fe (iron) such that a carrier concentration is $1\times10^{6}$ $cm^{-3}$ or more and $1\times10^{9}$ $cm^{-3}$ or less.

Figure 1:
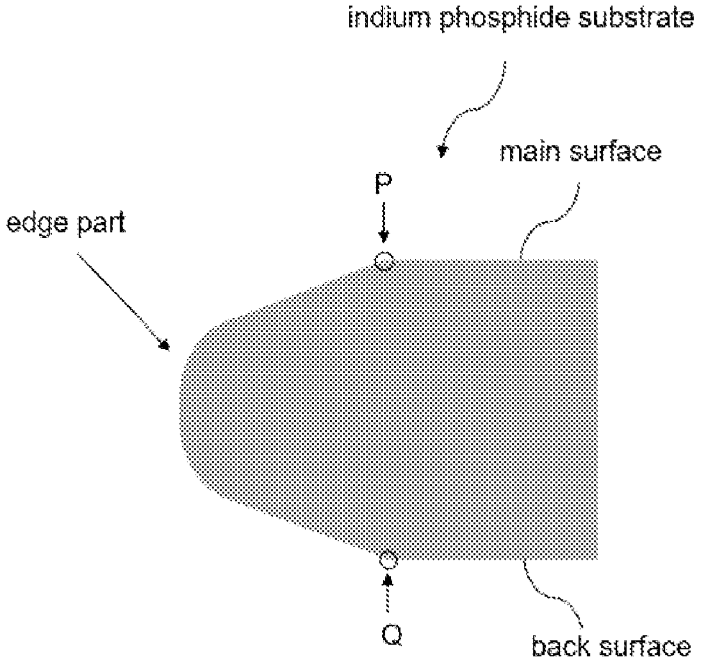
FIG. 1 is a cross-sectional schematic diagram of the indium phosphide substrate according to the present embodiment near the edge part.

FIG. 1 is a cross-sectional schematic diagram of the indium phosphide substrate according to the present embodiment near the edge part. The cross-section of the edge part of the indium phosphide substrate is curved, with rectangular corners shaved (chamfered) as shown in FIG. 1. In the present invention, "edge part" refers to the side surface of the indium phosphide substrate, i.e., the outer surface excluding the main surface and the back surface, specifically, the area from point P to point Q, across the side of the substrate, as shown in FIG. 1. The point P is located at the edge of the main surface (where the flat main surface begins to slope). The point Q is located at the edge of the back surface (where the flat back surface begins to slope). The "edge part" may also include the orientation flat (OF) and the index flat (IF).

FIG. 1 is a drawing to understand the main surface, the back surface, and the edge part in the indium phosphide substrate of the embodiment of the present invention, and these do not represent the indium phosphide substrates of the embodiment of the invention as they are.

A surface roughness of an edge part of the indium phosphide substrate of the embodiment of the present invention has a root mean square height Sq of 0.15 μm or less, as measured by a laser microscopy on the entire surface of the edge part. The root mean square height Sq of the edge part of the indium phosphide substrate is controlled to be 0.15 μm or less, which suppresses residual grinding abrasive used for machining after chamfering and polishing fluid at the edge part. This prevents residues (particles, etc.) from migrating to the substrate surface, thereby reducing contamination of the indium phosphide substrate surface and yield loss during substrate production. Preventing contamination of the substrate surface improves the surface quality after epitaxial growth is performed.

The root mean square height Sq of the edge part of the indium phosphide substrate of the embodiment of the present invention is a parameter representing the standard deviation from the mean plane, measured according to ISO 25178. The root mean square height Sq of the edge part of the indium phosphide substrate of the embodiment of the present invention can be measured, for example, using an OLYMPUS OLS5000 3D measurement laser microscope.

The surface roughness of an edge part of the indium phosphide substrate of the embodiment of the present invention preferably has the root mean square height Sq of 0.07 μm or less, as measured by a laser microscopy on the entire surface of the edge part. The lower limit of the root mean square height Sq of the edge part of the indium phosphide substrate of the embodiment of the present invention is not limited, but may be 0.01 μm or more or 0.015 μm or more.

The edge part of the indium phosphide substrate of the embodiment of the present invention preferably has a surface sloping from one surface; and a surface with curvature from the point where the sloping surface ends from one surface to the point where the sloping surface ends from the other surface; and the root mean square height Sq of the surface sloping from one surface, as measured by the laser microscopy, is preferably 0.15 μm or less; and the root mean square height Sq of the surface with curvature, as measured by the laser microscopy, is preferably 0.15 μm or less. This configuration better prevents residues (particles, etc.) from migrating to the substrate surface, thereby better controlling contamination of the indium phosphide substrate surface and yield loss during substrate production. Here, the "surface sloping from one surface" is the surface shown in FIG. 3 below as the surface sloping from the main surface, measurement area 1, and the "surface with curvature from the point where the sloping surface ends from one surface to the point where the sloping surface ends from the other surface" is the surface shown in FIG. 3 below, which is the measurement area 2 that is the arc area of the edge part being the surface with curvature from the position where the sloping surface ends from the main surface of measurement area 1 to the position where the sloping surface ends from the back surface.

Method for Manufacturing Indium Phosphide Substrate

Next, a method for manufacturing an indium phosphide substrate according to an embodiment of the present invention will be described.

The method for manufacturing the indium phosphide substrate starts from producing an indium phosphide ingot by a known method.

The indium phosphide ingot is then ground into a cylinder. At this time, orientation flats (OF) and index flats (IF) may be formed at predetermined locations on the outer periphery of a wafer.

A wafer having a main surface and a back surface is then cut out from the ground indium phosphide ingot. In this case, both ends of the crystal of the indium phosphide ingot are cut along a predetermined crystal plane using a wire saw to cut out a plurality of wafers to have a predetermined thickness.

Subsequently, in order to remove affected layers generated in the cutting step with the wire saw, both surfaces of the cut wafer are etched with a predetermined etching solution (primary etching). The wafer can be etched by immersing the entire wafer in the etching solution.

Subsequently, an outer peripheral portion of the wafer is chamfered, and at least one surface, preferably both surfaces, of the chamfered wafer may be polished. The polishing step is also called a lapping step, and the wafer is polished with certain abrasives to remove irregularities on the wafer surface while maintaining the flatness of the wafer.

After chamfering, or after the lapping step if the lapping is performed after chamfering, the entire surface of the edge part of the wafer produced after chamfering is polished with a polishing film of #4000 grit size. At this time, the entire edge part of the wafer is polished with the same polishing film of #4000 grit size, so the roughness of the entire edge part of the wafer is controlled to a similar level. That is, the polishing process controls the surface roughness of the edge part of the wafer so that the root mean square height Sq is 0.15 μm or less when measured with a laser microscope on the entire edge surface.

Both surfaces of the polished wafer are then etched with a predetermined etching solution (secondary etching). The wafer can be etched by immersing the entire wafer in the etching solution.

The main surface of the wafer is then polished with an abrasive material for mirror polishing to finish it into a mirror surface.

The resulting polished wafer is then washed to produce an indium phosphide wafer according to an embodiment of the present invention.

The indium phosphide substrate of the embodiment of the present invention may be a substrate with the edge part polished with the polishing film of #4000 grit size after chamfering as described above, or the indium phosphide substrate of the embodiment of the present invention may be a substrate produced by etching, mirror polishing, cleaning, etc. after being polished with a polishing film.

Semiconductor Epitaxial Wafer

By epitaxially growing a semiconductor thin film onto the main surface of the indium phosphide substrate according to the embodiment of the present invention by a known method, an epitaxial crystal layer can be formed to produce a semiconductor epitaxial wafer. As an example of the epitaxial growth, an InAlAs buffer layer, an InGaAs channel layer, an InAlAs spacer layer and an InP electron supply layer may be epitaxially grown onto the main surface of the indium phosphide substrate to form a HEMT structure. When producing a semiconductor epitaxial wafer having such a HEMT structure, in general, a mirror-finished indium phosphide substrate is etched with an etching solution such as sulfuric acid/hydrogen peroxide solution to remove impurities such as silicon (Si) adhering to the substrate surface. The back surface of the etched indium phosphide substrate is brought into contact with the susceptor and supported, and in this state, an epitaxial film is formed on the main surface of the indium phosphide substrate by molecular beam epitaxy (MBE) or metal organic chemical vapor deposition (MOCVD).

EXAMPLES

Hereinafter, Examples are provided for better understanding of the present invention and its advantages. However, the present invention is not limited to these Examples.

Example 1

First, ingots of indium phosphide single crystals grown with a predetermined diameter were prepared.

An outer circumference of each ingot of indium phosphide single crystals was ground into a cylinder. At this time, orientation flat (OF) and index flat (IF) were formed at predetermined locations on the outer periphery of the wafer.

A wafer having a main surface and a back surface was cut out from the ground indium phosphide ingot. In this case, both ends of the crystal of the indium phosphide ingot were cut along a predetermined crystal plane using a wire saw to cut out a plurality of wafers to have a predetermined thickness. In the step of cutting out the wafer, a new wire was continuously delivered while reciprocating the wire, and the indium phosphide ingot was moved toward a wire saw. The wafer diameter of the wafer produced herein was 76.2 mm and the wafer thickness was 750 μm.

Subsequently, in order to remove affected layers generated in the cutting step with the wire saw, the cut wafer was etched from both sides with a mixed solution of 85% by mass of an aqueous phosphoric acid solution and 30% by mass of a hydrogen peroxide solution (primary etching). The wafer was etched by immersing the entire wafer in the etching solution.

Subsequently, an outer peripheral portion of the wafer was chamfered, and both surfaces of the chamfered wafer were polished (lapping). In this case, the wafer was polished with abrasives to remove irregularities on the wafer surface while maintaining the flatness of the wafer.

Next, the entire surface of the edge part of the wafer produced by the chamfer was polished by pressing it against a polishing film of #4000 grit size.

Next, the wafer after polishing with the film was etched with a mixture of 85 mass % phosphoric acid solution, 30 mass % hydrogen peroxide solution, and ultrapure water with a total etching volume of 8 to 15 μm thickness from both sides (secondary etching). The wafer was etched by immersing the entire wafer in the aforementioned etchant.

The main surface of the wafer was then polished with abrasives for mirror polishing to finish it into a mirror surface, and then washed to produce an indium phosphide substrate.

Figure 2:
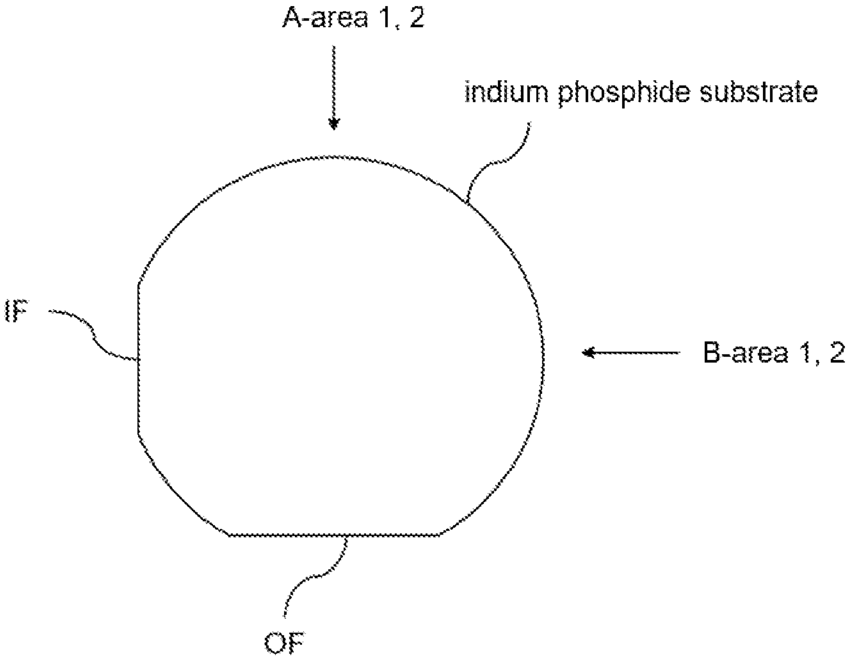
FIG. 2 is a schematic diagram of the indium phosphide substrate in plan view of the Example.
Figure 3:
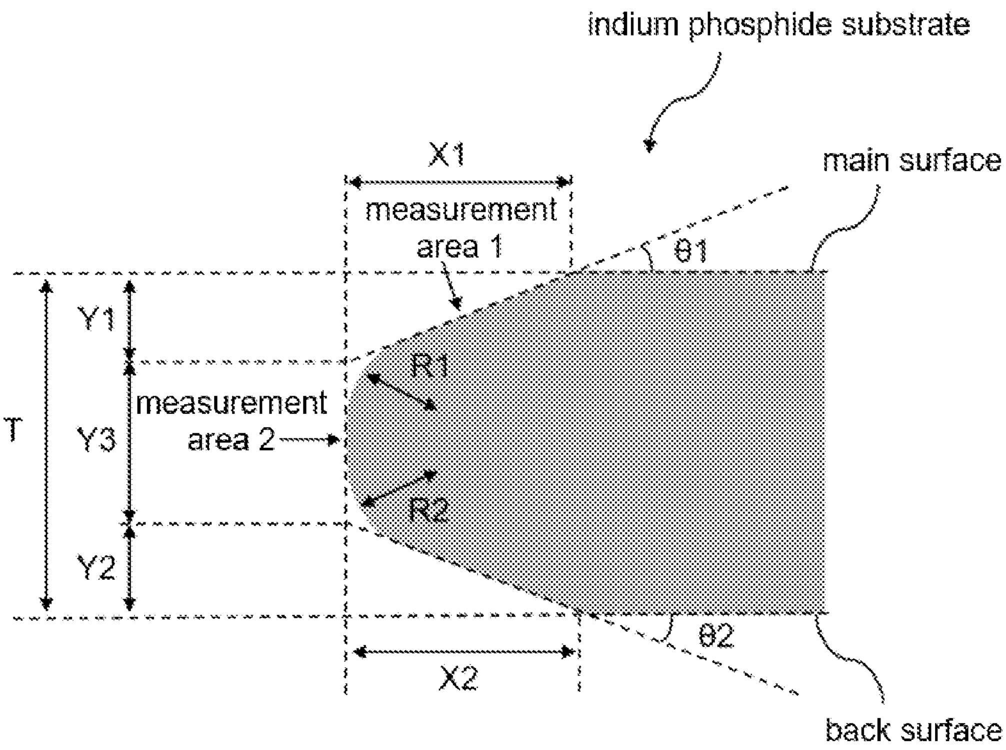
FIG. 3 is a cross-sectional schematic diagram of the indium phosphide substrate according to Example near the edge part.

FIG. 2 is a schematic diagram of the indium phosphide substrate in plan view of the Example 1. FIG. 3 is a cross-sectional schematic diagram of the indium phosphide substrate according to Example 1 near the edge part. In FIG. 3, T=650 μm, X1=494 μm, X2=432 μm, Y1=126 μm, Y2=108 μm, Y3=416 μm, R1=167 μm, R2=184 μm (R1 and R2 are the radius of curvature of rounded edge part), θ1=14.5 degrees, θ2=13.9 degrees (θ1 and θ2 are the inclination angles of edge part).

Comparative Example 1

In Comparative Example 1, an indium phosphide substrate was produced in the same manner as in Example 1 above, except that after the lapping process, the edges were not polished using a polishing film and secondary etching was performed.

Evaluation

As shown in FIG. 2, the edge part to be measured on the indium phosphide substrate was divided into two areas, one located on the opposite side of the OF (A-area) and the other on the opposite side of the IF (B-area). Furthermore, as shown in FIG. 3, (1) the surface sloping from the main surface was designated as measurement area 1, and (2) the arc area on the edge part that is a surface with curvature from the point where the sloping surface ends from main surface in measurement area 1 to the point where the sloping surface ends from the back surface is designated as measurement area 2.

Then, measurement area 1 in the A-area was designated as "A-area 1," measurement area 2 in the A-area as "A-area 2," measurement area 1 in the B-area as "B-area 1" and the measurement area 2 in the B-area as "B-area 2".

The root mean square height Sq was measured in a total of four areas at these edge parts (each measurement area size: 258 μm×258 μm), respectively, using an OLYMPUS OLS5000 3D measurement laser microscope. In order to remove curvature at the edges for evaluation, a cutoff filter (L filter: wavelength of 20 μm to be cut) was used for the measurement.

The evaluation results are shown in Table 1.

TABLE 1

| | | Sq (μm) |
|---|---|---|
| Example 1 | A-area 1 | 0.017 |
| | A-area 2 | 0.061 |
| | B-area 1 | 0.141 |
| | B-area 2 | 0.142 |
| Comparative Example 1 | A-area 1 | 0.321 |
| | A-area 2 | 0.592 |
| | B-area 1 | 0.286 |
| | B-area 2 | 0.593 |

Discussion

In Example 1, indium phosphide substrates were obtained with a root mean square height Sq of 0.15 μm or less, as measured by laser microscopy, for each surface roughness of A-area 1 and 2 and B-area 1 and 2 at the edge part of the substrate. The entire edge surface of the substrate was polished with a polishing film of #4000 grit size, and the sloping area corresponding to measurement area 1 on the entire edge surface is considered to have the same surface roughness as A-area 1 and B-area 1. In the entire edge surface, the relatively flat area (arc area) corresponding to the measurement area 2 of the edge part, such as the measurement area 2 described above, is considered to have the same surface roughness as A-area 2 and B-area 2.

The difference in the root mean square height Sq between the area 1 and area 2 of the edge part is considered to be due to the effect of polishing the substrate surface by mirror polishing after polishing the edge part with the polishing film. The root mean square height Sq are considered to be the same regardless of which area of the entire edge surface of the substrate is measured, as long as the entire edge surface is immediately after polishing with a polishing film of #4000 grit size.

The Si concentration on the surface of the substrate in Example 1 was measured at two points by TOF-SIMS analysis. The Si concentration was 80.3 ($\times10^{10}$ atoms/cm$^2$) and 115.8 ($\times10^{10}$ atoms/cm$^2$). The sensitivity coefficient of the analyzer was determined based on a standard sample of known concentration, and the ionic intensity of Si was quantified by normalizing it to the In intensity.

The analytical conditions for TOF-SIMS analysis were as follows:

Equipment name: Physical Electronics TRIFT III

Ion source: $Au^+$

Primary ion energy: 22 kV

Analysis area: 25 μm×25 μm

The indium phosphide substrate of Comparative Example 1 was not polished with a polishing film of #4000 grit size on the entire edge surface of the substrate after the chamfering and lapping processes. As a result, the root mean square height Sq was over 0.15 μm as measured by laser microscopy for each surface roughness of the A-area 1 and A-area 2 and B-area 1 and B-area 2 at the edge part of the substrate.

The invention claimed is:

1. An indium phosphide substrate, wherein an edge part of the substrate has a surface sloping from one surface of the edge part; and a surface with curvature from a point where the sloping surface ends from one surface of the edge part to a point where the sloping surface ends from a different surface of the edge part; and a root mean square height Sq of the surface sloping from one surface of the edge part, as measured by laser microscopy, is 0.15 μm or less; and a root mean square height Sq of the surface with curvature, as measured by laser microscopy, is 0.15 μm or less, and wherein the surface sloping from one surface of the edge part and the surface with curvature are both present on the edge part of the substrate.

2. The indium phosphide substrate according to claim 1, wherein the root mean square height Sq of the surface sloping from one surface, as measured by laser microscopy, is 0.07 μm or less.

3. A semiconductor epitaxial wafer, comprising the indium phosphide substrate according to claim 1, and an epitaxial crystal layer on a main surface of the indium phosphide substrate.

4. A method for manufacturing an indium phosphide substrate, comprising a process of chamfering an outer edge part of an indium phosphide wafer so that an edge part of the substrate has a surface sloping from one surface of the edge part; and a surface with curvature from a point where the sloping surface ends from one surface of the edge part to a point where the sloping surface ends from a different surface of the edge part, wherein the surface sloping from one surface of the edge part and the surface with curvature are both present on the edge part of the substrate, a process of polishing the entire surface of the edge part of the indium phosphide wafer after the chamfering with a #4000 grade polishing film, and a process of etching the indium phosphide wafer after polishing the edge part of the indium phosphide wafer.

5. The method for manufacturing an indium phosphide substrate according to claim 4, further comprising a process of polishing at least one surface of the indium phosphide wafer between the process of chamfering the outer edge part of the indium phosphide wafer and the process of polishing the entire surface of the edge part of the indium phosphide wafer after the chamfering with a #4000 grade polishing film.

* * * * *